US009385259B2

(12) United States Patent
Hahn et al.

(10) Patent No.: US 9,385,259 B2
(45) Date of Patent: Jul. 5, 2016

(54) METHOD FOR MANUFACTURING A METALLIZATION STRUCTURE COMPRISING ALUMINUM AND SILICON

(71) Applicant: SolarWorld Innovations GmbH, Freiberg (DE)

(72) Inventors: Harald Hahn, Dresden (DE); Martin Kutzer, Penig (DE); Christian Koch, Poehl (DE)

(73) Assignee: SolarWorld Innovations GmbH, Freiberg (DE)

( * ) Notice: Subject to any disclaimer, the term of this patent is extended or adjusted under 35 U.S.C. 154(b) by 198 days.

(21) Appl. No.: 13/705,199

(22) Filed: Dec. 5, 2012

(65) Prior Publication Data

US 2013/0153020 A1 Jun. 20, 2013

(30) Foreign Application Priority Data

Dec. 6, 2011 (DE) .......................... 10 2011 056 087

(51) Int. Cl.
| | |
|---|---|
| H01L 31/18 | (2006.01) |
| B05D 5/12 | (2006.01) |
| H01L 31/0224 | (2006.01) |
| H01B 1/22 | (2006.01) |
| H01L 31/042 | (2014.01) |
| H01L 31/05 | (2014.01) |
| C09D 5/24 | (2006.01) |

(52) U.S. Cl.
CPC *H01L 31/18* (2013.01); *H01B 1/22* (2013.01); *H01L 31/022425* (2013.01); *H01L 31/022441* (2013.01); *C09D 5/24* (2013.01); *Y02E 10/50* (2013.01); *Y02P 70/521* (2015.11)

(58) Field of Classification Search
CPC ... H01L 31/022425; C09D 11/52; C03C 8/18
USPC .......................................................... 438/98
See application file for complete search history.

(56) References Cited

U.S. PATENT DOCUMENTS

| 4,029,605 A | 6/1977 | Kosiorek |
| 5,118,362 A * | 6/1992 | St. Angelo ...... H01L 31/022425 |
| | | 136/256 |

(Continued)

FOREIGN PATENT DOCUMENTS

| CN | 1883012 A | 12/2006 |
| CN | 101622319 A | 1/2010 |

(Continued)

OTHER PUBLICATIONS

Urrejola, E. et al.: AL-SI Alloy Formation in Narrow P-SI Contact Areas. In: Proceedings of the 2nd Workshop on Metallization for Crystalline Silicon Solar Cells: Status, trends and new directions, Apr. 14 & 15, 2010, Constance, Germany, pp. 11-21, ISBN 978-3-89318-058-5.

(Continued)

*Primary Examiner* — Victor A Mandala
*Assistant Examiner* — Regan J Rundio
(74) *Attorney, Agent, or Firm* — Viering, Jentschura & Partner mbB

(57) ABSTRACT

In various embodiments, a solar cell screen-printing composition is provided, comprising aluminum; and silicon; the percentage by mass of silicon lying in a range from 5% to 95% of the sum of the percentages by mass of silicon and aluminum.

13 Claims, 8 Drawing Sheets

(56) References Cited

U.S. PATENT DOCUMENTS

| | | |
|---|---|---|
| 2005/0089679 A1 | 4/2005 | Ittel et al. |
| 2007/0295381 A1* | 12/2007 | Fujii et al. ............... 136/244 |
| 2008/0160265 A1 | 7/2008 | Hieslmair et al. |
| 2008/0161265 A1 | 7/2008 | Fallon et al. |
| 2008/0308892 A1* | 12/2008 | Wildpanner et al. .......... 257/453 |
| 2009/0017617 A1* | 1/2009 | Rohatgi et al. .............. 438/660 |
| 2010/0022078 A1* | 1/2010 | Rockenberger et al. ...... 438/585 |
| 2010/0139754 A1* | 6/2010 | Nakayashiki ... H01L 31/022425 136/256 |
| 2010/0209698 A1 | 8/2010 | Kornherr et al. |
| 2010/0251929 A1 | 10/2010 | Kagata et al. |
| 2010/0269893 A1* | 10/2010 | Prince et al. ............... 136/252 |
| 2011/0217809 A1 | 9/2011 | Li et al. |
| 2011/0240124 A1* | 10/2011 | Laudisio et al. ............. 136/261 |
| 2012/0067617 A1 | 3/2012 | Chun et al. |
| 2012/0118372 A1* | 5/2012 | Lee et al. ................... 136/256 |
| 2012/0129342 A1 | 5/2012 | Nakayashiki et al. |
| 2012/0145232 A1* | 6/2012 | Kim et al. ................... 136/256 |
| 2014/0335651 A1* | 11/2014 | LI et al. ...................... 438/98 |

FOREIGN PATENT DOCUMENTS

| | | |
|---|---|---|
| CN | 101728439 A | 6/2010 |
| CN | 102047346 A | 5/2011 |
| DE | 102009034594 A1 | 8/2010 |
| JP | 2008243600 A | 10/2008 |
| JP | 2010272890 A | 12/2010 |
| WO | 2005050673 A1 | 6/2005 |
| WO | 2009146354 A1 | 12/2009 |
| WO | 2010117224 A2 | 10/2010 |

OTHER PUBLICATIONS

English language abstract of DE 102009034594A1 published on Aug. 26, 2010.

Office Action received for the corresponding Chinese patent application No. 201210519624.5 dated Sep. 9, 2014, 9 Pages of office action and 10 pages of English Translation.

Office Action issued in the corresponding Chinese application No. 201210519624.5 dated Jan. 30, 2014, 9 Pages.

Taiwanese Office Action based on application No. 101145817 dated Jan. 22, 2015 (8 pages) (for reference purpose only).

Chinese Office Action based on application No. 201210519624.5 dated Mar. 9, 2015 (4 pages of English translation).

Minutes of oral hearing based on the German patent application No. 10 2011 056 087.4 (9 pages) dated Jun. 18, 2015 (for reference purpose only).

* cited by examiner

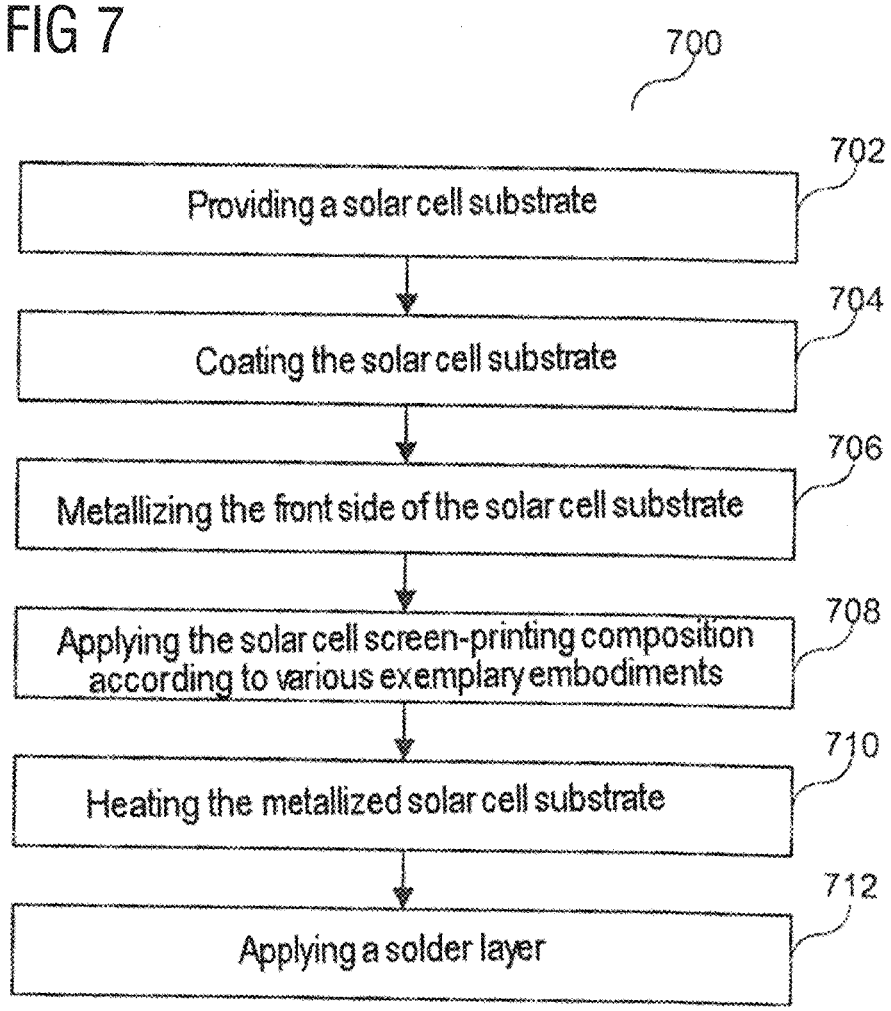

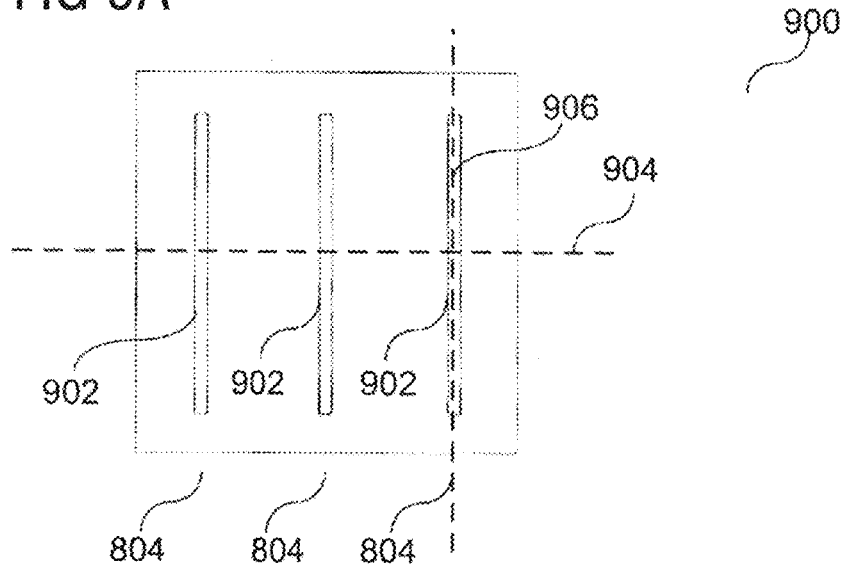
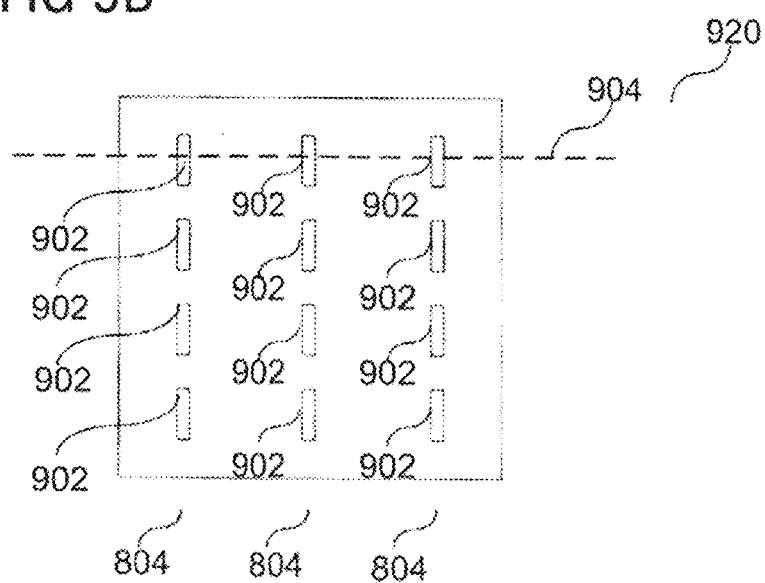

FIG 11A
FIG 11C
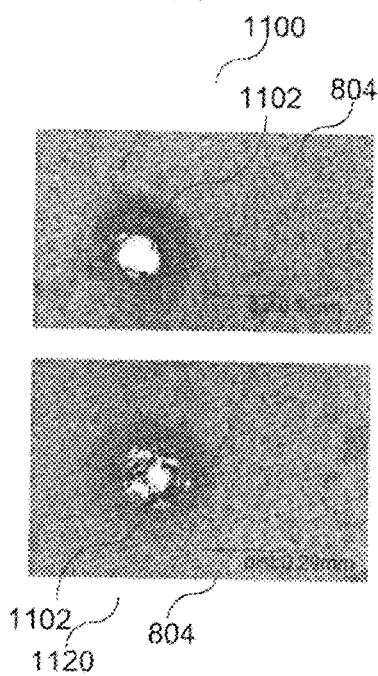
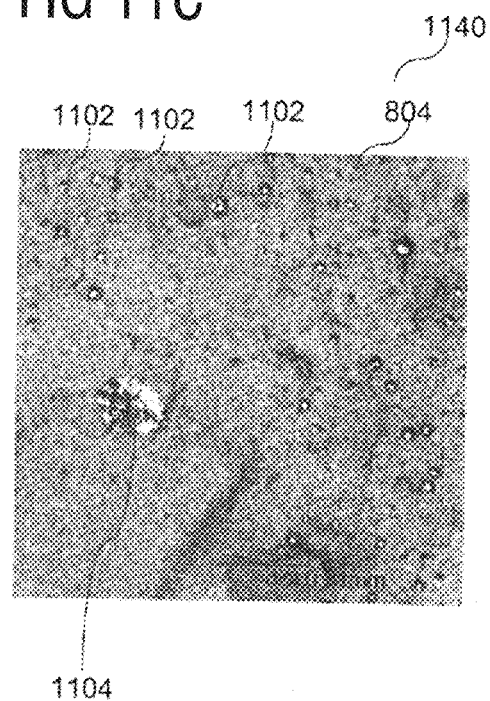
FIG 11B
FIG 12
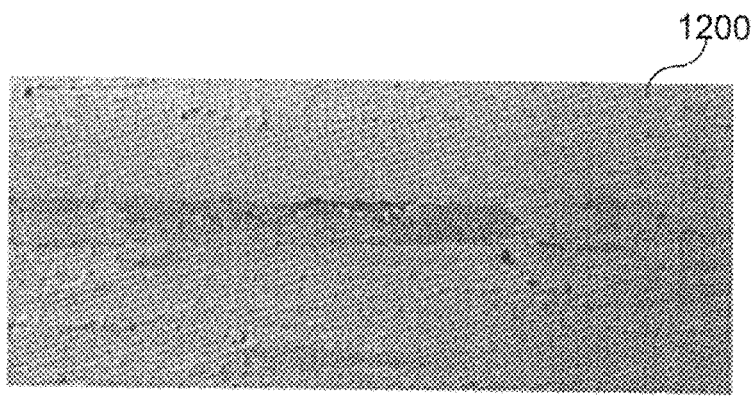

METHOD FOR MANUFACTURING A METALLIZATION STRUCTURE COMPRISING ALUMINUM AND SILICON

CROSS-REFERENCE TO RELATED APPLICATION

This application claims priority to German Patent Application Serial No. 10 2011 056 087.4, which was filed Dec. 6, 2011, and is incorporated herein by reference in its entirety.

TECHNICAL FIELD

Various embodiments relate to a solar cell screen-printing composition, a solar cell and a method for manufacturing a metallization structure.

BACKGROUND

For the manufacturing of a backside metallization of a solar cell, generally an aluminum backside paste is printed onto the back side of the solar cell by screen printing and then the solar cell with the printed-on aluminum backside paste is heated. The aluminum backside paste is highly porous, in order to avoid bending of the solar cell during cooling after heating because of the different coefficients of thermal expansion of the aluminum of the backside paste and of the semiconductor material of the solar cell. The porosity of the aluminum backside paste (even after printing on and heating) has the effect of further impairing the in any case already poor mechanical properties of the aluminum; thus, for example, the low yield stress of the aluminum decreases even further.

Because of the poor mechanical properties of the aluminum backside paste (or of layers that consist of this paste), many direct connecting technologies of typical cell connectors or else wires on aluminum layers that have been printed with such a conventional aluminum backside paste fail, even though the connection between the cell connector and the porous aluminum layer itself is very stable, because the printed-on aluminum layer cohesively tears within itself.

Consequently, a mechanically stable aluminum layer cannot be applied to a solar cell by printing processes when a conventional aluminum backside paste is used, because it either leads to excessive bending or rupture of the solar cell during cooling or has poor mechanical properties owing to its porosity, which is necessary in order to prevent the mechanical stresses.

For these reasons, in order to establish electrical contact on the back side of a solar cell, silver-containing busbars are usually printed onto the back side of a solar cell. However, silver is expensive (and, what is more, increasing prices and a shortage of silver can be expected in the future) and, furthermore, no electrical backside field (back surface field—BSF) can be formed in the regions in which a silver-containing busbar is printed on. This leads to a reduction in the efficiency of the solar cell. Even the printing on of what are known as soldering pads instead of continuous busbars cannot entirely obviate the need for silver to be used nor can a continuous electrical back surface field be provided in this way.

DE 10 2009 034 594 A1 discloses a method for manufacturing a crystalline silicon solar cell with full-area, alloyed backside metallization. According to DE 10 2009 034 594 A1, a thin aluminum layer is sputtered or vapor-deposited onto the entire back side of a solar cell. Then, backside busbars are printed on using a silver or silver-aluminum paste and after that the region between the busbars including silver is printed with a thicker layer of aluminum screen-printing paste. This method has the disadvantage that, on account of the need for silver and the expenditure required for the method step of applying the thin aluminum layer, it is costly.

SUMMARY

In various embodiments, a solar cell screen-printing composition is provided, including: aluminum; and silicon; the percentage by mass of silicon lying in a range from approximately 5% to approximately 95% of the sum of the percentages by mass of silicon and aluminum.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 7 shows a process diagram of a method for coating a solar cell according to various embodiments;

FIGS. 9a and 9b show a schematic solar cell substrate according to various embodiments;

FIGS. 11a to 11c show optical micrographs of a solar cell substrate with a coating according to various embodiments; and FIG. 12 shows an SEM of a surface of a solar cell substrate with a coating according to various embodiments after a pulling-off test.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In the following detailed description, reference is made to the accompanying drawings, which form part of this description and in which specific embodiments of how the invention can be implemented are shown for illustrative purposes. In this respect, directional terminology such as for instance "upper", "lower", "forward", "rearward", "front", "rear", etc. is used with reference to the orientation of the figure(s) described. Since components of embodiments can be positioned in a number of different orientations, the directional terminology serves for illustrative purposes and is not in any way restrictive. It goes without saying that other embodiments can be used and structural or logical changes can be made without departing from the scope of protection of the present invention. It goes without saying that the features of the various embodiments described herein by way of example can be combined with one another, unless otherwise specifically indicated. The following detailed description should therefore not be understood in a restrictive sense, and the scope of protection of the present invention is defined by the appended claims.

Within this description, the terms "connected" and "coupled" are used to describe both a direct and an indirect connection and a direct and an indirect coupling. In the figures, identical or similar elements are provided with identical reference symbols wherever this is expedient.

In various embodiments, a solar cell is understood as meaning a device that converts radiation energy of predominantly visible light (for example at least part of the light in the visible wavelength range from approximately 300 nm to approximately 1150 nm; it should be noted that ultraviolet (UV) radiation and/or infrared (IR) radiation may also be additionally converted), for example of sunlight, directly into electrical energy by means of what is known as the photovoltaic effect.

In various embodiments, a solar module is understood as meaning an electrically connectable device including a plurality of solar cells (which are interconnected with one another in series and/or in parallel), and optionally including protection against the weather (for example glass), an embedding and a framing.

As described with reference to FIGS. 1 to 4, in various embodiments it has been found that a mechanically stable aluminum layer cannot be applied to solar cells by means of printing processes/printing techniques (for example by means of screen printing or by means of pad printing) and conventional printing compositions.

Figure 1:
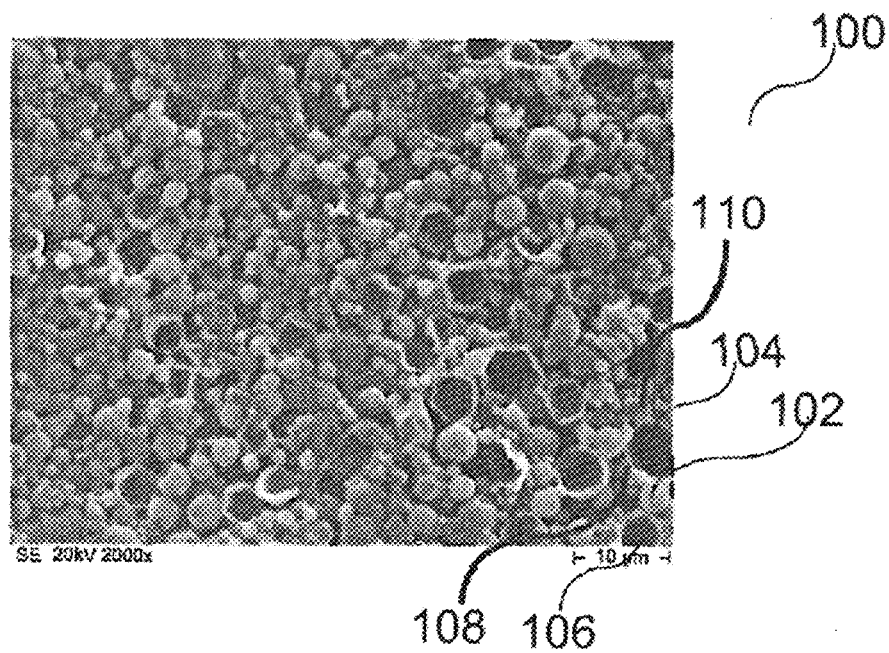
FIG. 1 shows an SEM (scanning electron micrograph) of a back side of a cell that has been printed with a conventional aluminum backside paste.

FIG. 1 shows an SEM (scanning electron micrograph) of a back side of a cell that has been printed with a conventional aluminum backside paste, the porous structure of a conventional aluminum printing composition 100 after heating to a temperature of 800° C. being represented. Many particles, which are only partially connected to one another, can be seen. This porosity causes the poor mechanical properties of the printing composition, since the particles 102, 104, 106, 108, 110 can easily lose contact with one another when mechanical stresses occur, which leads to a tearing of the aluminum backside paste.

Figure 2:
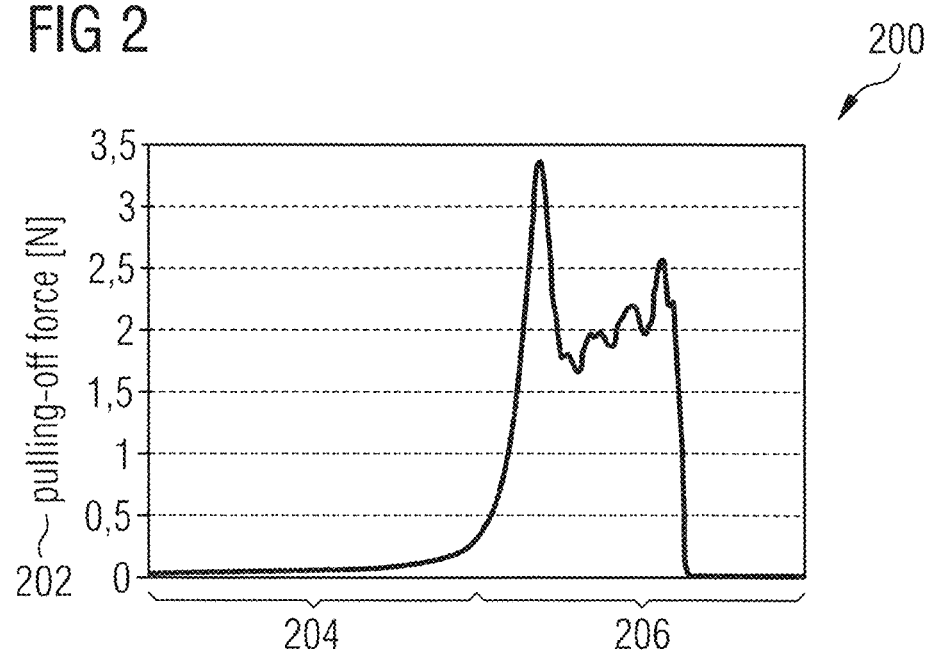
FIG. 2 shows a diagram which shows the variation in the pulling-off force to pull a cell connector off a surface of a solar cell, the surface being partially printed with a conventional aluminum backside paste and sputtered over completely with nickel.

FIG. 2 shows a diagram 200, which shows the variation in the pulling-off force 202 for pulling a solar cell connector off from a solar cell. The solar cell is in this case partially coated with a conventional aluminum printing composition 100 in such a way that one region of the solar cell remains uncoated (first region 204 in FIG. 2). The solar cell is also coated on its entire surface with a thin nickel layer, which has been produced by the sputtering of nickel. The solar cell therefore has a region which is coated with a conventional aluminum printing composition and a thin nickel layer lying thereover, and a region which is coated only with the thin nickel layer (second region 206 in FIG. 2). It is evident from the diagram 200 that the pulling-off force for pulling the cell connector off from the solar cell in the region which has the aluminum printing composition is very low, while it is increased significantly in the region which has only the thin nickel layer. This shows that cell connectors may have a mechanically stable connection with a solar cell, but an aluminum printing composition 100 from the prior art cannot withstand high mechanical loading.

Figure 3:
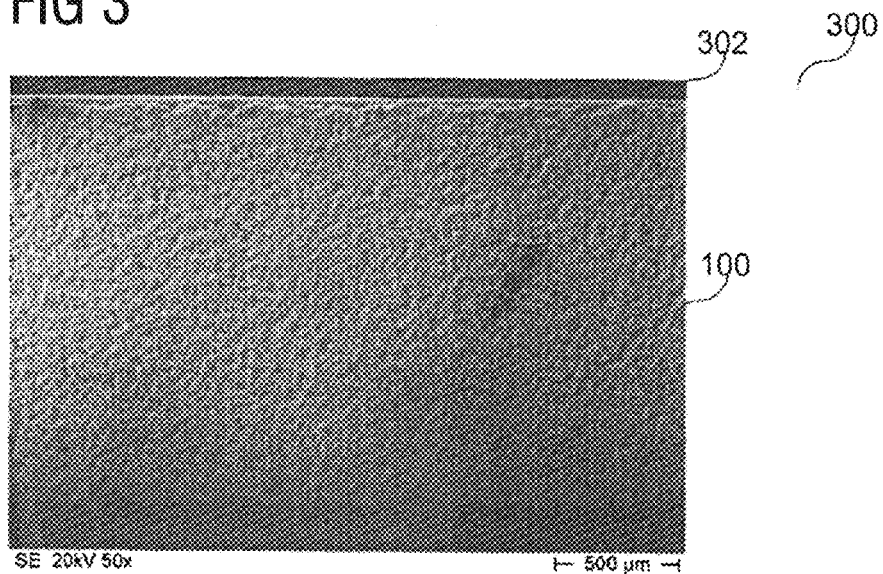
FIG. 3 shows an SEM of a cell connector which has been torn off from a solar cell that has been coated with a conventional aluminum backside paste.
Figure 4:
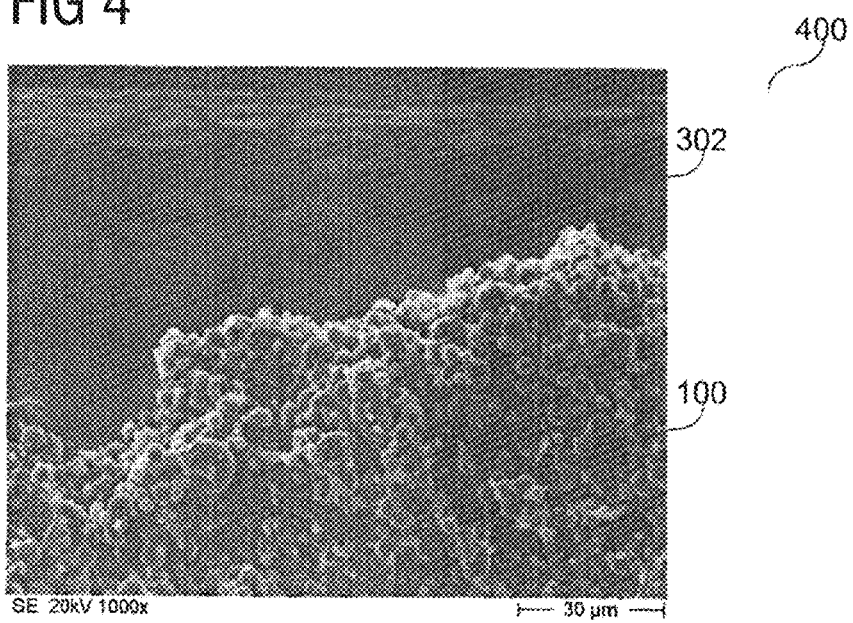
FIG. 4 shows an SEM that shows a view of a detail of the cell connector of FIG. 3.

In this respect, FIG. 3 and FIG. 4 show an SEM (scanning electron micrograph) 300, 400 of the surface of a cell connector 302 torn from the surface of a solar cell coated with a conventional aluminum printing composition 100. FIG. 3 shows a view 300 of that side of the cell connector 302 that was in contact with the conventional aluminum printing composition 100 (i.e. evidently the "underside" of the cell connector 302). The porous structure of the aluminum printing composition 100 is visible, which shows that the conventional aluminum printing composition 100 has torn within itself.

FIG. 4, which shows a view of a detail 400 of FIG. 3, shows in the upper region the solder of the cell connector 302 and in the lower region the conventional porous aluminum printing composition 100. It is evident that it is not the connection between the cell connector 302 and the conventional aluminum printing composition 100 that has torn but that the conventional aluminum printing composition 100 has torn within itself because of its poor mechanical properties.

Various embodiments of the invention therefore provide a solar cell screen-printing composition which is both cohesion-stabilized, i.e. resistant to tearing within itself, and does not exert any, or only small, mechanical stresses on a solar cell.

Figure 5:
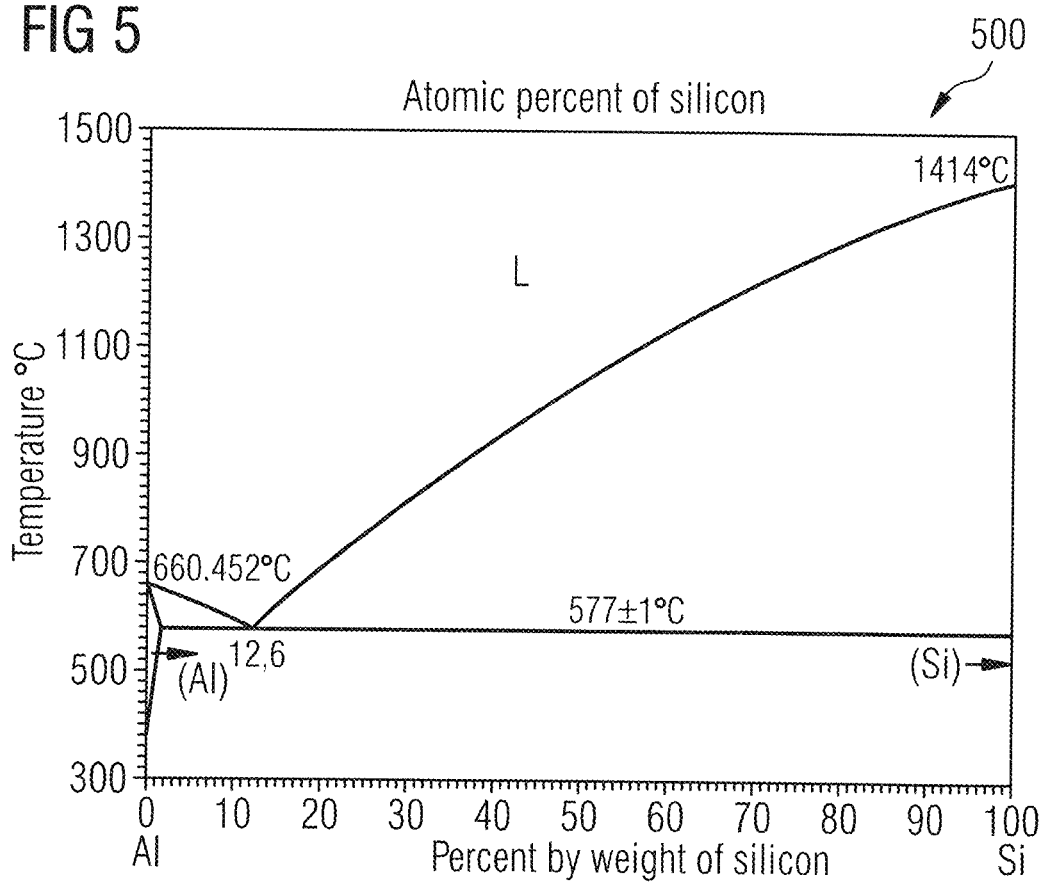
FIG. 5 shows an aluminum-silicon phase diagram.

With reference to FIG. 5, which shows an aluminum-silicon phase diagram 500, embodiments of the invention provide a solar cell screen-printing composition which includes at least aluminum and silicon. According to embodiments, the amounts of aluminum and/or silicon contained in the solar cell screen-printing composition may be chosen dependently on one another. According to some embodiments, the silicon fraction may in this case be in a range from approximately 5 percent by weight to approximately 95 percent by weight (for example percent by mass) of the sum of the weight (for example the mass) of silicon and aluminum in the solar cell screen-printing composition.

In other embodiments, the silicon fraction may lie in a range from approximately 5 percent by mass to approximately 15 percent by mass of the sum of the masses of the aluminum and the silicon in the solar cell screen-printing composition. In various embodiments, the silicon fraction is exactly or substantially 12.6 percent by mass of the sum of the mass of the aluminum and the silicon in the solar cell screen-printing composition. These embodiments substantially provide an aluminum-silicon eutectic, which has a lower melting point (about 577° C.) than pure aluminum (about 660° C.).

In various embodiments, the silicon fraction may lie in a range from approximately 5 percent by mass to approximately 30 percent by mass of the sum of the mass of the aluminum and the mass of the silicon in the solar cell screen-printing composition. This may lead to a solar cell screen-printing composition which for example completely melts at temperatures below about 800° C. (which are reached for example in a solar cell firing process).

In further embodiments, the silicon fraction may lie in a range from approximately 30 percent by mass to approximately 95 percent by mass of the sum of the mass of the aluminum and the mass of the silicon in the solar cell screen-printing composition. This may lead to a solar cell screen-printing composition which only completely melts at higher temperatures, for example only at temperatures above 800° C.

Various embodiments provide a solar cell screen-printing composition which has a silicon fraction which corresponds to approximately 70 percent by mass to approximately 95 percent by mass of the sum of the masses of aluminum and silicon in the solar cell screen-printing composition. The silicon of this solar cell screen-printing composition is substantially not melted during a solar cell production process (as described in more detail below) but remains pulpy, which leads to the microstructure 600 shown schematically in FIG. 6. The solar cell screen-printing composition according to this embodiment has a coefficient of thermal expansion which is very similar to that of a semiconductor, such as for example silicon or gallium arsenide. This has the effect that the connection of a semiconductor (for example solar cell substrate) and the solar cell screen-printing composition according to various embodiments is substantially free from thermal stresses after heating, even in the case of connections over a large area.

Figure 6:
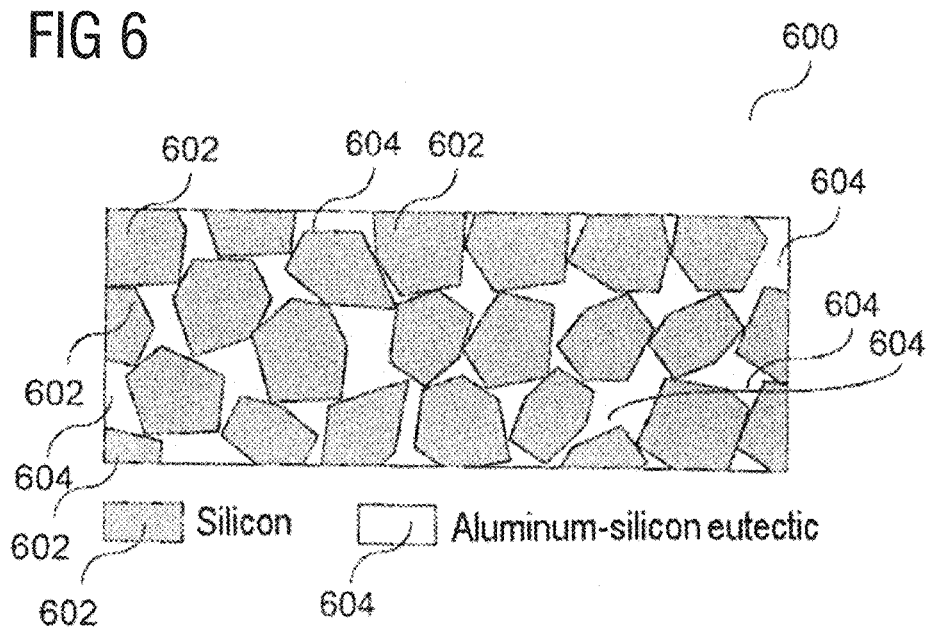
FIG. 6 shows a schematic microstructure of a solar cell screen-printing composition according to various embodiments.

FIG. 6 shows the microstructure 600 of a solar cell screen-printing composition according to various embodiments (for example after a solar cell metallization process according to one embodiment), which has more silicon mass than aluminum mass, for example which has a silicon fraction which corresponds to approximately 70 percent by mass to approximately 95 percent by mass of the sum of the masses of aluminum and silicon in the solar cell screen-printing composition. FIG. 6 shows the microstructure 600, which has substantially two phases 602, 604 (i.e. two solid phases): a first phase 602, which substantially includes silicon (for example grains of substantially silicon), and a second phase 604, which consists of a eutectic aluminum-silicon structure (for example of an aluminum subphase and a silicon subphase, which together form a eutectic structure). On account of the increased silicon fraction, the thermal expansion of the solar cell screen-printing composition corresponds substantially to the thermal expansion of silicon, whereby the solar cell is not strained, or substantially not strained, during heating and/or cooling.

As shown inter alia in FIG. 6, the solar cell screen-printing composition is substantially non-porous, i.e. it forms a solid body without air pockets, whereby the mechanical properties can be improved.

According to embodiments, the solar cell screen-printing composition may also include a glass frit, i.e. superficially melted and partially baked-together glass powder, or glass powder. The glass frit may in this case conform for example to the standard ISO 4793. The glass powder may, for example, include $SiO_2$, $Na_2O$, $B_2O_3$ and/or $K_2O$.

Some embodiments of the solar cell screen-printing composition form a solid-liquid mixture including aluminum and silicon, which takes the form of a solid, and one or more liquid solvents, such as for example dialkyl glycol ether, pine oil and/or butoxy ethoxyethanol. The particle size and/or the amount of solids and the type of the solvent or solvents may be chosen such that a paste with a viscosity of approximately 10 Pa s to approximately 500 Pa s is obtained.

In some embodiments, the average particle diameter of the solids of the solar cell screen-printing composition is approximately 0.5 μm to approximately 20 μm.

All of the embodiments of the solar cell screen-printing composition can be distinguished by the fact that they substantially do not include any silver.

FIG. 7 shows a method 700 for metallizing a solar cell (or a solar cell substrate) according to various embodiments. According to other embodiments, the method 700 may include other, additional method steps; the sequence of the method steps may be any possible permutation of the method steps described and/or one or more method steps may be omitted whenever appropriate.

The optional method step 702 includes the provision of a solar cell substrate 802 (cf. FIG. 8).

The substrate 802 may include or consist of at least one photovoltaic layer. Alternatively, at least one photovoltaic layer may be arranged on or over the substrate 802. The photovoltaic layer may include or consist of semiconductor material (such as for example silicon), a compound semiconductor material (such as for example a III-V compound semiconductor material (such as for example GaAs), a II-VI compound semiconductor material (such as for example CdTe), a I-III-V compound semiconductor material (such as for example copper-indium-disulfide)). As a further alternative, the photovoltaic layer may include or consist of organic material. In various embodiments, the silicon may include or consist of monocrystalline silicon, polycrystalline silicon, amorphous silicon, and/or microcrystalline silicon. In various embodiments, the photovoltaic layer may include or consist of a semiconductor junction structure such as for example a pn junction structure, a pin junction structure, a Schottky-like junction structure, and the like. The substrate 810 and/or the photovoltaic layer may be provided with a basic doping of a first conduction type.

In various embodiments, the basic doping in the solar cell substrate 802 may have a doping concentration (for example a doping of the first conduction type, for example a doping with boron (B))) in a range from approximately $10^{13}$ cm$^{-3}$ to $10^{18}$ cm$^{-3}$, for example in a range from approximately $10^{14}$ cm$^{-3}$ to $10^{17}$ cm$^{-3}$, for example in a range from approximately $10^{15}$ cm$^{-3}$ to $2*10^{16}$ cm$^{-3}$.

The solar cell substrate 802 may be produced from a solar cell wafer and may for example have a round form, such as for example a circular form or an elliptical form, or a polygonal form, such as for example a square form. In various embodiments, the solar cells of the solar module may, however, also have a non-square form. In these cases, the solar cells of the solar module may for example be formed by separating (for example cutting) and consequently dividing one or more solar cells (also referred to in their form as standard solar cells) into a plurality of non-square or square solar cells. In various embodiments, it may be provided in these cases to perform adaptations of the contact structures in the standard solar cell, for example backside transverse structures may be additionally provided.

In various embodiments, the solar cell produced may have the following dimensions: a width in a range from approximately 5 cm to approximately 50 cm, a length in a range from approximately 5 cm to approximately 50 cm, and a thickness in a range from approximately 100 μm to approximately 300 μm.

As has been described above, in various embodiments a base region may be formed in the photovoltaic layer, for example doped with dopant of a first doping type (also referred to as the first conduction type), for example with dopant of the p doping type, for example with dopant of the IIIrd main group of the periodic table, for example with boron (B).

Furthermore, in various embodiments an emitter region may be formed (for example by diffusion of a dopant into the substrate), doped with dopant of a second doping type (also referred to as the second conduction type), the second doping type being opposite to the first doping type, for example with dopant of the n doping type, for example with dopant of the Vth main group of the periodic table, for example with phosphorus (P).

After the doping of the emitter region, by for example a vapor phase diffusion, the phosphosilicate glass in the case of a phosphorus diffusion can be removed by means of a PSG etch, in for example a 2.5% to 25% HF solution.

In various embodiments, an antireflective layer (for example including or consisting of silicon nitride) may optionally be applied to the exposed upper surface of the emitter region.

In various embodiments, the regions with increased dopant concentration may be doped with a suitable dopant, such as for example phosphorus. In various embodiments, the second conduction type may be a p conduction type and the first conduction type may be an n conduction type. Alternatively, in various embodiments the second conduction type may be an n conduction type and the first conduction type may be a p conduction type.

Figure 8A:
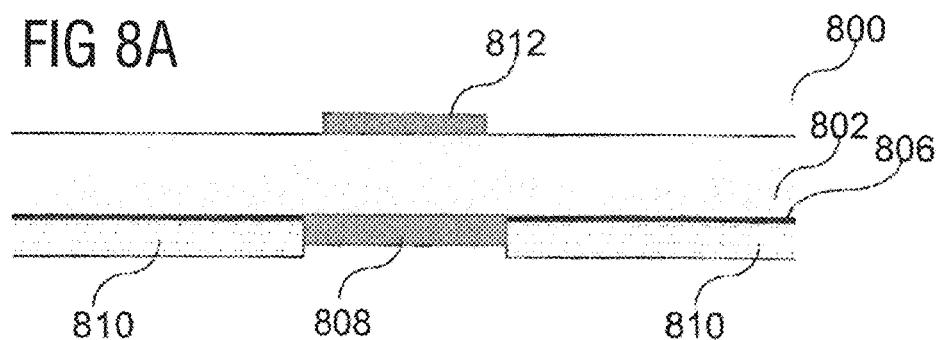
FIG. 8a shows a schematic solar cell substrate.
Figure 8B:
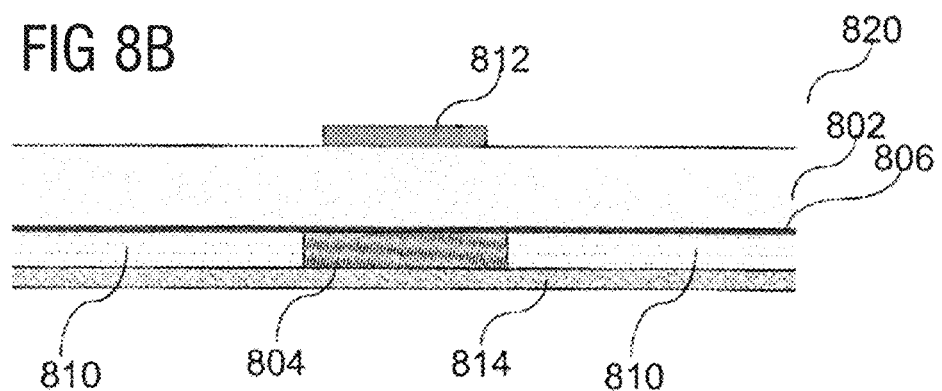
FIGS. 8b to 8d show a schematic solar cell substrate according to various embodiments.
Figure 8C:
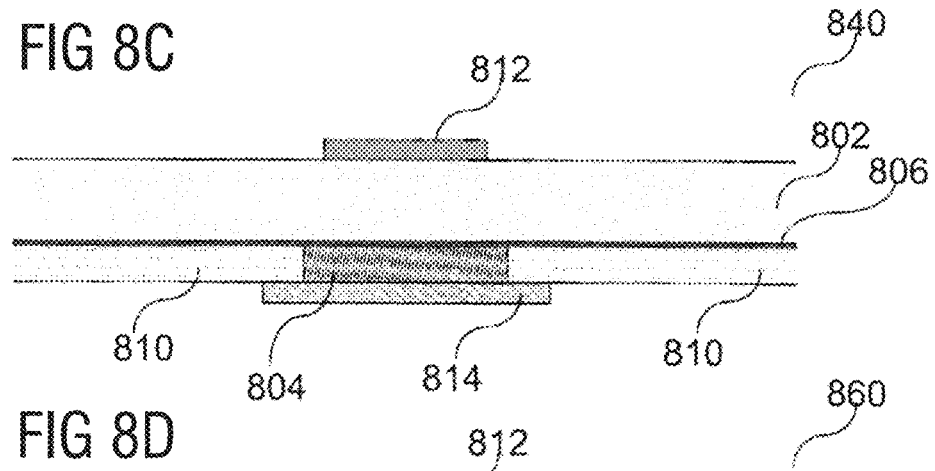
Figure 8D:
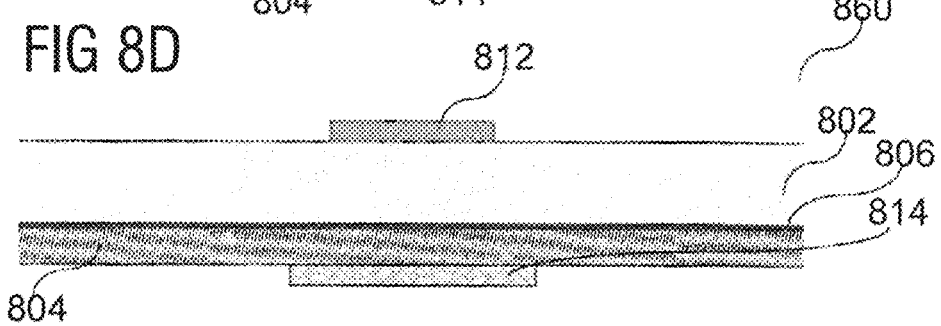

With further reference to FIG. 7 and FIG. 8B to FIG. 8D (FIG. 8A shows in comparison the structure of a conventional solar cell 800), the solar cell substrate 802 may be coated in 704 with a solar cell screen-printing composition. FIG. 8B to FIG. 8D show various cross-sectional views 820, 840, 860 according to various embodiments.

For the coating, in various embodiments printing processes may be used, such as for example screen-printing processes.

In embodiments, a solar cell screen-printing composition, which includes aluminum and silicon, may be used for the coating of the solar cell, for example a solar cell screen-printing composition according to various embodiments as described above.

In some embodiments, 704 may include the coating of the solar cell substrate 802 in a first region 804 on a surface of the solar cell substrate 802. The first region 804 may in this case be located on the emitter side (i.e. the side on which the generally high-energy electromagnetic radiation (for example light) impinges for the power generation; hereafter also referred to as the "front side" or "light incidence side") of the solar cell substrate 802, and/or on the back side (i.e. the side of the solar cell substrate 802 that is opposite from the emitter side of the solar cell substrate 802). The first region 804 may also extend on any other surface area, for example the side faces, of the solar cell substrate 802.

In embodiments, the coating of the first region 804 of the solar cell substrate 802 with a solar cell screen-printing composition according to various embodiments allows an electrical back surface field 806 to be produced by means of the aluminum cations (for example $Al^{3+}$) of the solar cell screen-printing composition, and these can diffuse into the solar cell substrate 802. In various embodiments, the diffusion may be intensified by the increased temperature during the heating described below. At the same time, the silicon fraction (where possible diffusion of the silicon into the solar cell substrate 802) of the solar cell screen-printing composition according to various embodiments does not lead to adverse influencing of the semiconductor properties of the solar cell substrate 802. In comparison with the solar cell according to FIG. 8A, which shows a conventional electrical back surface field 806, it is shown in FIG. 8B to FIG. 8D that, according to various embodiments, the electrical back surface field 806 may extend over an entire surface area of a solar cell substrate 810, and not be interrupted at locations at which electrical contact areas 808 are formed (for example silver soldering pads 808 in FIG. 8A). According to various embodiments, this can lead to increased efficiency.

According to some embodiments, the first region 804 may completely cover any surface or other of the solar cell substrate 802 (see FIG. 8D) or completely cover a surface of the solar cell substrate 802 apart from a peripheral side border of the solar cell substrate 802, for example with a width in a range from approximately 1 mm to approximately 20 mm, for example with a width in a range from approximately 1 mm to approximately 10 mm, for example with a width in a range from approximately 1 mm to approximately 5 mm.

According to embodiments, the first region 804 may consist of or be formed from a plurality of sub-regions 804. The number of sub-regions may be, for example, one to three, three to eight, eight to twelve, twelve to sixteen or any other number.

With additional reference to FIG. 9A and FIG. 9B (which show a respective plan view 900, 920 of a solar cell according to various embodiments), each sub-region 804 may extend along the longitudinal axis 902 (that is the extent of each sub-region that has the maximum possible geometrical length of extent in a plane). The sub-regions 804 may substantially include a rectangular form, a square form, a triangular form, a circular form (the longitudinal axis 902 may in this case be any axis through the center point of the circular form) or any other polygonal form or free form. One or some sub-regions 804 may have one form (for example a rectangular form), while at the same time one or more other sub-regions 804 may have another form (for example a square form) or other forms. All sub-regions 804 may also have the same form or each sub-region 804 may have a different form.

With reference to FIG. 9A and FIG. 9B, the longitudinal axes 902 of the sub-regions 804 may be arranged in various arrangements in relation to one another. As is shown in FIG. 9A, the longitudinal axes 902 of the sub-regions 804 may be arranged such that they are respectively parallel to one another. The transverse distance (i.e. the distance transversely in relation to the longitudinal axis 902) between a plurality of sub-regions 804 may be the same, or it may be different in each case between two sub-regions 804. The transverse distance of sub-regions 804 from a peripheral border of the solar cell may be the same or may be different.

The longitudinal axes 902 of the sub-regions 804 may also be arranged such that they are not parallel to one another, i.e. that they define an angle between them, for example an angle in a range from approximately 30° to approximately 45° and/or in a range from approximately 45° to approximately 90°.

Some sub-regions 804 (or their respective longitudinal axes 902) may be arranged parallel to one another, while at the same time other sub-regions 804 of the solar cell substrate 802 may define an angle between one another.

The transverse axes 904 (the maximum length of extent in the plane of a sub-region 804 transversely in relation to its longitudinal axes 902) of the sub-regions 804 may have the same length or have a different length in each case, for example the length of the transverse axes 904 may be in a range from approximately 0.2 mm to approximately 10 mm, for example in a range from approximately 1 mm to approximately 2 mm, or any other value.

With reference to FIG. 9B, in some embodiments the longitudinal axes 902 of the sub-regions 804 may also be arranged such that they extend along an imaginary straight line. In this respect, one, two, three, four, a multiplicity or all of the sub-regions 804 may be arranged such that their respective longitudinal axes 902 extend on an imaginary straight line (indicated in FIG. 9A by a dashed line 906). The sub-regions 802 may also be arranged such that some (for example two or e.g. three or more than three) sub-regions 804 are arranged such that their longitudinal axes 902 lie on a first imaginary straight line 906 and there are one or more further imaginary straight lines 906 (for example altogether two or three or four or more imaginary straight lines 906), on which sub-regions 804 are also arranged, so that their longitudinal axes 902 lie on the imaginary straight lines 906. The imaginary straight lines 906 may be parallel to one another or respectively define angles in relation to one another.

In this case, two sub-regions 804 may respectively have the same transverse distance from the nearest sub-regions 804 in the transverse direction and/or respectively have a different transverse distance, for example a distance in a range from approximately 2 mm to approximately 50 mm, for example in a range from approximately 10 mm to approximately 30 mm, for example in a range from approximately 20 mm to approximately 25 mm.

In various embodiments, the sub-regions 804 may also respectively have the same longitudinal distance (i.e. the distance in the direction of the longitudinal axis 904) from the nearest sub-region 804 in the longitudinal direction or have a different distance in each case.

According to various embodiments, the solar cell substrate 802 may optionally be coated in a second region 810. The second region 810 may be alongside the first region 804. The second region 810 may adjoin the first region 804, so that layers that are deposited on the first region 804 and the second region 810 are connected to one another in an electrically conductive manner. The second region 810 may be the region of a surface (for example emitter and/or back side) of the solar cell substrate 802 that is not enclosed by the first region 804. A peripheral region of the solar cell substrate 802, for example with a width in a range from approximately 1 mm to approximately 20 mm, for example with a width in a range from approximately 1 mm to approximately 10 mm, for example with a width in a range from approximately 1 mm to approximately 5 mm, may in some embodiments be neither part of the first region 804 nor part of the second region 810, i.e. it may be free of any coating during and after the method step 704 (for example in order to avoid electrical short-circuits when a plurality of solar cell substrates 802 are combined to form solar modules).

In some embodiments, the coating of the first region 804 is carried out with a solar cell printing composition which includes at least aluminum and silicon (for example with a solar cell screen-printing composition described above according to various embodiments) and the coating of the second region 810 is carried out with a printing composition which substantially includes no silicon (for example with an aluminum printing paste).

In embodiments, if the first region 804 substantially includes a full, complete surface (for example substantially the entire surface of the emitter side or back side) of a solar cell substrate 802 (for example apart from a peripheral region as described above), the coating is carried out for example with a solar cell screen-printing composition according to various embodiments which includes a silicon fraction that corresponds to approximately 70 percent by mass to approximately 95 percent by mass of the sum of the masses of aluminum and silicon in the solar cell screen-printing composition.

With reference to FIG. 7, in 706 a metallization 812 may be applied on the emitter side of the solar cell substrate.

The emitter-side metallization 812 (for example front-side metallization) may, for example, be applied by the depositing of silver metallization lines.

With reference to FIG. 7, furthermore, in 708 the solar cell screen-printing composition described above according to various embodiments may be applied. In various embodiments, the solar cell screen-printing composition may be partially or completely applied to the back side of the solar cell.

Furthermore, in 710 the (metallized) solar cell substrate 802 may be heated according to various embodiments after the coating.

The heating (for example firing) 710 may take place at a temperature in a range from approximately 600° C. to approximately 1000° C., for example at a temperature in a range from approximately 700° C. to approximately 900° C., for example at a temperature of approximately 800° C. The temperature may be maintained (substantially constantly) during the heating for about 2 to 60 seconds; the heating rate may be about 60° C./s and the cooling rate may be about 60° C./s.

The heating may have the effect that the solvents of the solar cell screen-printing composition and/or other printing compositions evaporate (i.e. go over into the atmosphere as gas).

In various embodiments, the heating 710 may have the effect that, in dependence on the temperature and the silicon and aluminum fractions according to the phase diagram 500 in FIG. 5, the solar cell screen-printing composition melts and/or partially melts and/or does not melt.

In various embodiments, for example if the silicon fraction of the solar cell screen-printing composition is in a range from approximately 30 percent by weight to approximately 95 percent by weight or in a range from approximately 70 percent by weight to approximately 95 percent by weight of the sum of the aluminum mass and the silicon mass of the solar cell screen-printing composition, the silicon phase of the solar cell screen-printing composition may be substantially not melted during the heating, while the eutectic aluminum-silicon phase melts, becomes liquid and fills the interspaces between the grains of the silicon phase (compare FIG. 6). In various embodiments, the solar cell screen-printing composition may have a pulpy paste structure during the heating, i.e. not be completely liquefied. This leads to a mechanically stable coating, which does not introduce any, or scarcely any, mechanical stresses into the solar cell substrate 802 during the cooling (or after the cooling to room temperature or operating temperature of the solar cell).

In various embodiments, for example if the silicon fraction is in a range from approximately 5 percent by weight to approximately 15 percent by weight or in a range from approximately 5 percent by weight to approximately 30 percent by weight of the sum of the masses of the aluminum and the silicon in the solar cell screen-printing composition, the solar cell screen-printing composition may be completely melted during the heating. This leads to a mechanically very stable coating after the cooling.

The heating of the solar cell 710 may be carried out in an oxygen-free and/or reduced gas atmosphere, for example in an atmosphere which includes argon and hydrogen gas and has a low oxygen partial pressure.

In various embodiments, increases in productivity and efficiency can be achieved, since silicon is obtainable in high purity and cannot contaminate the semiconductor substrate by (self) diffusion. In addition, in various embodiments a process step can be saved, since the solar cell screen-printing composition according to various embodiments (particularly with a high relative silicon fraction) can be printed onto an entire surface (for example back side) of a solar cell substrate, making it possible to save a method step in comparison with the conventional procedure (cf. FIG. 8A; in graphic terms, the backside metallization and the contact points for example may be applied with a single method step or a single solar cell screen-printing composition). In addition, a solar cell as described above no longer has a porous (for example back-side) surface, whereby the mechanical strength and the corrosion resistance of the solar cell and of solar cell modules produced therefrom are improved. Furthermore, the risk of lamination defects caused by the aluminum paste (for example blistering) is reduced.

According to various embodiments, with reference to FIG. 7, in 712 a solderable metallization layer 814 may be deposited on the coated first region 804 and/or on the coated second region 810 of the solar cell substrate 802. According to embodiments, the solderable metallization layer 814 may for example be deposited by vapor deposition, sputtering, electrochemical deposition (for example electrodeposition), chemical vapor deposition (CVD), physical vapor deposition (PVD) and/or thermal spraying processes (for example plasma spraying or wire arc spraying). The solderable metallization layer 814 may include metals such as copper, nickel, tin; lead, bismuth, indium, zinc and/or silver and/or other chemical elements.

The solderable metallization layer 814 may be deposited over the first region 804 (cf. FIG. 8B to FIG. 8D) and/or over the second region 810 (cf. FIG. 8B and FIG. 8C). In various embodiments (cf. FIG. 8B), the solderable metallization layer 814 may also be deposited over one or more (coated) surface areas of the solar cell substrate 802, so that it covers the entire surface area (for example the entire back side of the solar cell substrate 802).

The solderable metallization layer 814 may, however, also be deposited such that it covers only the first region 804 and/or the second region 810, in each case completely or only partially.

Further embodiments are described below.

Figure 10:
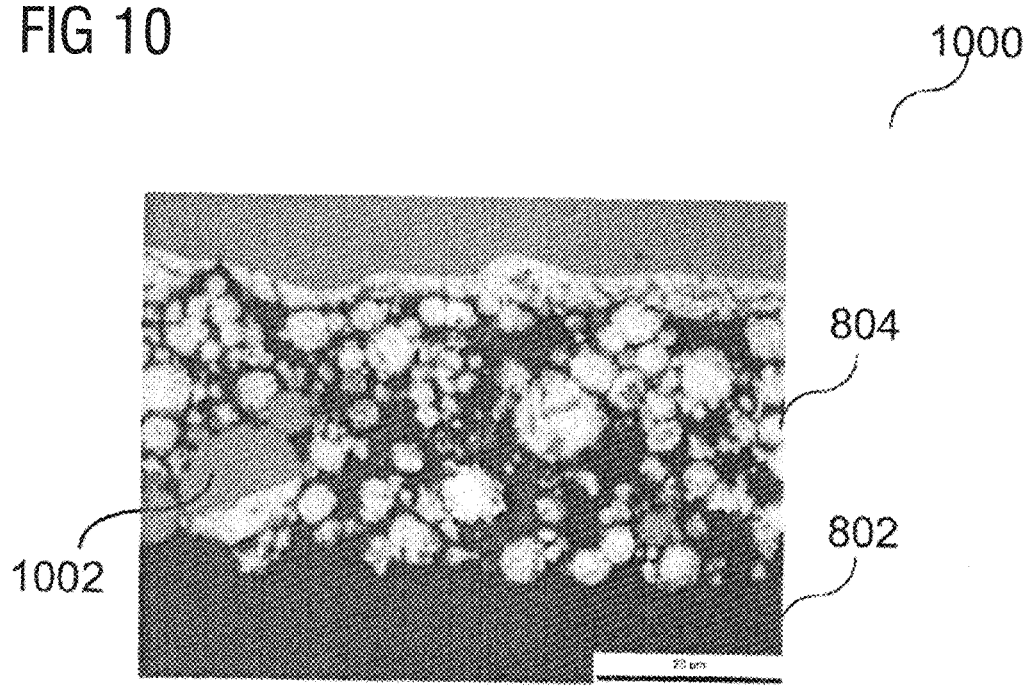
FIG. 10 shows an optical micrograph of a solar cell substrate with a coating according to various embodiments.

FIG. 10 shows an optical-microscopic cross-sectional view (micrograph) 1000 of a coating of a solar cell screen-printing composition in a first region 804 on one side of the solar cell substrate 802 after heating. The solar cell screen-printing composition of FIG. 10 has a silicon fraction which is 13 percent by mass of the sum of the mass of silicon and the mass of aluminum in the solar cell screen-printing composition (cf. FIG. 5; the composition is substantially eutectic). FIG. 5 shows newly formed particles 1002, in which fine-crystalline silicon and aluminum are present simultaneously. This shows that, during the heating, the eutectic (or the eutectic structure) has formed. However, as a result of the mixture of the components and on account of the relatively short heating period, a full-area and uniform formation of the eutectic structure did not come about, for one reason because both silicon and aluminum form oxide layers that are very strong and difficult to break through.

FIG. 11A to FIG. 11C show the surface of the coating in various representations 1100, 1120, 1140, which are shown in FIG. 10. FIG. 11A and FIG. 11B show small droplets 1102 of the eutectic structure on the coating, which have grown so firmly together with the wafer of the solar cell substrate 802 that they damage the wafer when they break off, as the rupture point 1104 in FIG. 11C shows. This shows both the internal, cohesive, mechanical strength of the solar cell screen-printing composition according to an embodiment and the mechanically stable connection of the solar cell screen-printing composition according to various embodiments with the wafer.

However, there substantially remains the loose structure that can be achieved with a conventional solar cell screen-printing composition. Therefore, in various embodiments the pulling-off resistance of a cell connector (after the surface of the coating of silicon screen-printing composition has been sputtered with nickel) is not substantially increased, though regions of a small area with a high mechanical strength have formed. These regions with high mechanical strength may lead to the wafer of the solar cell substrate being damaged in a pulling-off test with a cell connector soldered onto the surface of the coating of solar cell screen-printing composition.

FIG. 12 shows such a local wafer outbreak 1200 after the tearing off of a cell connector from a first region 804 with a coating of a solar cell screen-printing composition according to an embodiment and illustrates the good mechanical properties of the solar cell screen-printing composition.

In various embodiments, a solar cell screen-printing composition is provided, including: aluminum; and silicon; the percentage by mass of silicon lying in a range from approximately 5% to approximately 95% of the sum of the percentages by mass of silicon and aluminum.

In various embodiments, a solar cell screen-printing composition is provided, including: aluminum; and silicon; the percentage by mass of silicon being at least 0.05 and at most 0.95 of the sum of the percentages by mass of silicon and aluminum.

According to one refinement, the percentage by mass of silicon may be at most 0.33 of the sum of the percentages by mass of silicon and aluminum.

According to another refinement, the percentage by mass of silicon may lie in a range from approximately 5% to approximately 30% of the sum of the percentages by mass of silicon and aluminum.

According to another refinement, the percentage by mass of silicon may lie in a range from approximately 5% to approximately 15% of the sum of the percentages by mass of silicon and aluminum.

According to another refinement, the percentage by mass of silicon may lie in a range from approximately 30% to approximately 95% of the sum of the percentages by mass of silicon and aluminum.

According to another refinement, the percentage by mass of silicon may be at most 0.15 of the sum of the percentages by mass of silicon and aluminum.

According to another refinement, the percentage by mass of silicon may be at least 0.33 of the sum of the percentages by mass of silicon and aluminum.

According to another refinement, the percentage by mass of silicon may be at least 0.7 of the sum of the percentages by mass of silicon and aluminum.

According to another refinement, the solar cell screen-printing composition may be a paste with a viscosity in a range from approximately 10 Pa s to approximately 500 Pa s.

According to another refinement, the composition may additionally include a glass frit.

According to another refinement, the composition may include etchants and solvents with a maximum percentage by mass of 25%.

According to another refinement, the composition may be substantially free of silver.

According to another refinement, the silicon and the aluminum may be in particle form with an average particle size in a range from approximately 0.5 µm to approximately 20 µm.

In various embodiments a solar cell is provided, including a solar cell screen-printing composition such as that described above and hereafter.

According to one refinement, the solar cell may have an n-type emitter and the back side of the solar cell may have the solar cell screen-printing composition.

According to another refinement, the back side of the solar cell may have the solar cell screen-printing composition.

According to another refinement, the solar cell screen-printing composition may cover the back sides over the full surface area.

According to another refinement, the solar cell screen-printing composition may only partially cover the back sides.

According to another refinement, the solar cell may have a p-type emitter and the front side of the solar cell may have the solar cell screen-printing composition.

According to another refinement, the back side of the solar cell may have an electrical back surface field.

In various embodiments, a method for metallizing a solar cell is provided, including: coating a region of a solar cell with a solar cell screen-printing composition, the solar cell screen-printing composition including at least aluminum and silicon; and heating the solar cell coated with the solar cell screen-printing composition.

According to a refinement, in the solar cell screen-printing composition the percentage by mass of silicon may lie in a range from approximately 5% to approximately 95% of the sum of the percentages by mass of silicon and aluminum.

According to another refinement, in the solar cell screen-printing composition the percentage by mass of silicon may be at least 0.05 and at most 0.95 of the sum of the percentages by mass of silicon and aluminum.

According to another refinement, the solar cell screen-printing composition may be coated on the back side of the solar cell.

According to another refinement, before the heating of the solar cell, another region of the solar cell, which adjoins the coated region, may be coated with a solar cell screen-printing composition which is substantially free of silicon.

According to another refinement, after the heating of the solar cell, an additional layer, which contains a solderable material, may be applied on or over the solar cell screen-printing composition.

According to another refinement, the additional layer may also be deposited over a part of the other region.

According to another refinement, the additional layer may completely cover the region.

According to another refinement, the additional layer may completely cover the other region.

According to another refinement, the solderable material may be deposited by vapor deposition, sputtering, electrodeposition, by means of a process of chemical deposition from the vapor phase (Chemical Vapor Deposition, CVD), or by means of thermal spraying.

According to another refinement, the solderable material may include at least one of Cu, Ni, Sn, Pb, Bi, In, Zn or Ag.

According to another refinement, during the heating the solar cell may be heated to a temperature in a range from approximately 700° C. to approximately 900° C., for example to a temperature of approximately 800° C.

According to another refinement, the heating may be carried out in a reducing gas atmosphere.

According to another refinement, a screen-printing process may be used for the coating of the solar cell with the solar cell screen-printing composition.

According to another refinement, the region may include a plurality of sub-regions not adjoining one another.

According to another refinement, at least some of the plurality of sub-regions not adjoining one another may have an elongate form and respectively extend along a longitudinal axis, the sub-regions adjoining one another being arranged with their respective longitudinal axes parallel to one another.

According to another refinement, the number of sub-regions may be two or three or more than three.

According to another refinement, the plurality of sub-regions not adjoining one another may respectively extend along a longitudinal axis and the respective longitudinal axes may lie on an imaginary straight line.

According to another refinement, the number of sub-regions may be less than four or four or more than four.

According to another refinement, the plurality of sub-regions not adjoining one another may respectively extend along a longitudinal axis, there being at least two sub-regions of which the longitudinal axes are parallel to one another and there being at least two sub-regions of which the longitudinal axes lie on an imaginary straight line.

According to another refinement, each sub-region may have a substantially rectangular form, the shorter sides of the rectangle having a length in a range from approximately 0.2 mm to approximately 10 mm, for example in a range from approximately 1 mm to approximately 2 mm.

According to another refinement, the solar cell may have a p-type emitter or an n-type emitter.

According to another refinement, the solar cell may have an n-type emitter and the solar cell screen-printing composition may be applied on the back side of the solar cell.

According to another refinement, the solar cell may have a p-type emitter and the solar cell screen-printing composition may be applied on the front side of the solar cell.

According to another refinement, the solar cell may be substantially free of phosphorus glass at the beginning of the method, in other words before the coating with the solar cell screen-printing composition.

According to another refinement, the solar cell may have an antireflective coating at the beginning of the method, in other words before the coating with the solar cell screen-printing composition.

According to another refinement, the heating may be carried out such that the solar cell screen-printing composition completely melts.

According to another refinement, the heating may be carried out such that the phase of the solar cell screen-printing composition that substantially includes silicon does not melt.

According to another refinement, the method may also include printing a frontside metallization onto a front side of the solar cell.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for metallizing a solar cell, the method comprising:
   coating a first region of the solar cell with a first solar cell screen-printing composition, the first solar cell screen-printing composition comprising at least aluminum and silicon, a percentage by mass of the silicon lying in a range from approximately 5% to approximately 30% of a sum of percentages by mass of silicon and aluminum;
   coating a second region of the solar cell, which adjoins the coated first region, with a second solar cell screen-printing composition which is substantially free of silicon,
   wherein the first and second solar cell screen-printing compositions on the first region and the second region are connected to one another in an electrically conductive manner;

heating the solar cell coated with the first and second solar cell screen-printing compositions; and after the heating of the solar cell, an additional layer, which contains a solderable material, being applied directly on or directly over at least the first solar cell screen-printing composition.

2. The method as claimed in claim 1,
wherein the first region of the solar cell is coated with the first solar cell screen-printing composition by means of a screen-printing process.

3. The method as claimed in claim 1,
wherein the solderable material is applied by vapor deposition, sputtering, electrodeposition, CVD or thermal spraying.

4. The method as claimed in claim 1,
wherein the solar cell is heated during the heating to a temperature in a range from approximately 700° C. to approximately 900° C.

5. The method as claimed in claim 1,
wherein the solar cell has an n-type emitter and the first solar cell screen-printing composition is applied to a back side of the solar cell.

6. The method as claimed in claim 1,
wherein the solar cell has a p-type emitter and the first solar cell screen-printing composition is applied to a front side of the solar cell.

7. The method as claimed in claim 1,
wherein in the first solar cell screen-printing composition the percentage by mass of silicon lies in a range from approximately 5% to approximately 15% of the sum of percentages by mass of silicon and aluminum.

8. The method as claimed in claim 1,
wherein the first solar cell screen-printing composition is a paste with a viscosity in a range from approximately 10 Pa·s to approximately 500 Pa·s.

9. The method as claimed in claim 1,
wherein the first solar cell screen-printing composition comprises etchants and solvents with a maximum percentage by mass of 25%.

10. The method as claimed in claim 1,
wherein the silicon and the aluminum of the first solar cell screen-printing composition are in elemental particle form with an average size in a range from approximately 0.5 μm to approximately 20 μm.

11. The method as claimed in claim 1,
wherein the first solar cell screen-printing composition only partially covers a back side of the solar cell.

12. The method as claimed in claim 1,
wherein the heating forms an electrical back surface field over the first region and the second region.

13. The method as claimed in claim 1,
wherein the first solar cell screen-printing composition and the second solar cell screen-printing composition substantially do not include silver.

\* \* \* \* \*